United States Patent [19]

Yamamura

[11] Patent Number: 4,503,345

[45] Date of Patent: Mar. 5, 1985

[54] MOS/LSI TIME DELAY CIRCUIT

[75] Inventor: Michael M. Yamamura, Cupertino, Calif.

[73] Assignee: Rockwell International Corporation, El Segundo, Calif.

[21] Appl. No.: 394,741

[22] Filed: Jul. 2, 1982

[51] Int. Cl.$^3$ ............... H03K 17/284; H03K 17/693; H03K 19/094

[52] U.S. Cl. ................................. 307/605; 307/443; 307/481; 307/246; 307/582; 307/269; 307/594; 307/601

[58] Field of Search .............. 307/443, 453, 481, 363, 307/246, 571, 575, 577, 581–584, 269, 297, 590, 594, 601, 605

[56] References Cited

U.S. PATENT DOCUMENTS

| | | | |
|---|---|---|---|
| 4,196,362 | 4/1980 | Maehashi | 307/594 X |
| 4,300,065 | 11/1981 | Remedi et al. | 307/594 X |
| 4,388,538 | 6/1983 | Ikeda | 307/594 X |
| 4,409,501 | 10/1983 | Eickerman et al. | 307/594 |
| 4,430,587 | 2/1984 | Tennyson | 307/590 |

Primary Examiner—Stanley D. Miller
Assistant Examiner—D. R. Hudspeth
Attorney, Agent, or Firm—H. Fredrick Hamann; James F. Kirk

[57] ABSTRACT

A time delay circuit having a voltage reference node adapted to receive a reference voltage from a reference voltage source, the time delay circuit comprising: a resistor, a capacitance means having a first and second node, the first node being connected to a reference potential, such as ground, the resistor being connected between the input signal node and the capacitance means second node, a first field effect transistor having a gate and a conduction channel having a first and second terminal, the first field effect transistor gate being connected to the voltage reference node, the first field effect transistor conduction channel second terminal being connected to the capacitance means second node, the first field effect transistor conduction channel first terminal being connected to the output signal node, a second field effect transistor having a gate and a conduction channel having a first and second terminal, the second field effect transistor device gate being connected to a clock signal node, the second field effect transistor device conduction channel first terminal being connected to the output signal node, the second field effect transistor device conduction channel second terminal being connected to the voltage source; whereby the time delay circuit being responsive to the clock signal first logic level precharges the output signal voltage on the capacitive load to a corresponding logic level voltage and at a time subsequent to the precharge interval, the time delay circuit, in response to a clocked input signal discharges the output signal node voltage after a predetermined delay interval measured from the input signal changing from a first logic level to a second logic level.

16 Claims, 2 Drawing Figures

MOS/LSI TIME DELAY CIRCUIT

BACKGROUND OF THE INVENTION

1. Field of the Invention

This invention relates to integrated circuits, and particularly to metal oxide semiconductor large scale integrated circuit (MOS/LSI) devices having n-channel or p-channel MOS field effect transistors, such as are commonly used in hand calculators, home and office computers, automotive and industrial control systems, games, and other commercial products. MOS/LSI devices use numerous circuit designs to achieve specific functions. One of the circuit designs used in MOS/LSI devices is a time delay circuit, i.e., a circuit which provides an output signal delayed by a predetermined time from the occurrence of an input signal. A time delay circuit designed for use in MOS/LSI devices should be relatively insensitive to process variations and variations in temperature. The invention circuit provides these features and is particularly suitable for manufacture by standard integrated circuit processing steps.

2. Description of the Prior Art

The most common time delay circuit used in MOS/LSI device design consists of a string of simple inverters. These inverters are generally used in tandem pairs to provide a delayed noninverted output signal in response to an input signal. Each inverter circuit is comprised of a depletion mode field effect transistor connected between a voltage source, such as VDD, and the output of the circuit, the depletion mode field effect transistor having its gate connected to its source and correspondingly the output of the inverter circuit. The output of the inverter circuit is connected to ground through an enhancement mode field effect transistor, the input of the circuit being connected to the gate of this enhancement mode field effect transistor. To increase the delay afforded by an inverter circuit, capacitance is formed on the output of the inverter. By increasing the amount of this capacitance and by concurrently decreasing the conductivity of the pull up depletion mode field effect transistor, additional delay per inverter circuit is obtained. Large delays are obtained by designing the required number of pairs of inverter circuits into the time delay circuit to obtain the desired delay.

The above referenced prior art delay circuit is sensitive to temperature and process variations. In addition, the above referenced prior art circuit design requires a relatively large number of components to obtain even small time delays.

SUMMARY OF THE INVENTION

It is, therefore a major objective of this invention to provide a time delay circuit for use in MOS/LSI devices, using relatively few components and providing an output signal having a predetermined delay in response to an input signal.

Another objective of this invention is to provide a time delay circuit that is relatively insensitive to temperature variations.

Another objective of this invention is to provide a time delay circuit that is compatible with manufacturing techniques used in MOS/LSI circuit processes.

These and other objectives of the invention are realized in a time delay circuit adapted to operate between a voltage source and a reference potential, such as ground, and having a voltage reference node adapted to receive a reference voltage from a reference voltage source, an input signal source adapted to provide an input signal at an input signal node, a first and second clock signal source respectively providing first and second clock signals, the first clock signal being periodic and having a first and second logic level. The time delay circuit also has a clock signal node adapted to receive the second clock signal having a first and second logic level from the second clock signal source, the second clock signal being a logical complement of the first clock signal. The input signal is further adapted to change from a first logic level to a second logic level at times concurrent with the second clock signal changing from a first logic level to a second logic level. The circuit also has an output signal node coupled to a capacitive load. The invention time delay circuit comprises: a resistor, a capacitance means, having a first and second node, the first node being connected to the reference potential, the resistor being connected between the input signal node and the capacitance means second node. The circuit also has a first multiterminal semiconductor device having a control grid and a conduction channel having a first and second terminal, the first multiterminal semiconductor device control grid being connected to the voltage reference node. The first multiterminal semiconductor device conduction channel second terminal is connected to the capacitance means second node. The first multiterminal semiconductor device conduction channel first terminal is connected to the output signal node.

The time delay circuit also has a second multiterminal semiconductor device having a control grid and a conduction channel having a first and second terminal. The second multiterminal semiconductor device control grid is connected to the clock signal node. The second multiterminal semiconductor device conduction channel first terminal is connected to the output signal node. The second multiterminal semiconductor device conduction channel second terminal is connected to the voltage source; whereby the time delay circuit being responsive to the second clock signal first logic level precharges the output signal node voltage on the capacitive load to a corresponding first logic level voltage and at a time subsequent to the precharge interval, the time delay circuit in response to a clocked input signal discharges the output signal node voltage after a predetermined interval measured from the input signal changing from a first logic level to a second logic level.

In a more particular preferred embodiment the first and second multiterminal semiconductor devices are field effect transistors.

In another more particular preferred embodiment, the voltage source is positive with respect to the reference potential and the first and second multiterminal semiconductor devices are n-channel enhancement mode metal oxide field effect transistors. In yet another even particular embodiment the resistor is formed from polycrystalline silicon.

In a next particular alternative preferred embodiment, the capacitance means is further comprised of a third multiterminal semiconductor device having a control grid and a conduction channel having a first terminal, the control grid being connected to the capacitance means second node and the conduction channel first terminal being connected to the capacitance means first node; whereby the depletion mode metal oxide field effect transistor provides a predetermined capacitance between the capacitance means first and second node.

In a most particular preferred embodiment, the first and second multiterminal semicoductor devices are n-channel enhancement mode metal oxide field effect transistors, and the first clock signal first logic level is a positive voltage with respect to the reference potential, the positive voltage having a value relatively close to the voltage source voltage. The input signal voltage first logic level is a positive voltage with respect to the reference potential, the positive voltage having a value relatively close to the voltage source voltage. Each of the clock signal second logic level and the input signal second logic level voltages have values relatively close to the reference potential, or ground.

DESCRIPTION OF THE PREFERRED EMBODIMENT

Figure 1:
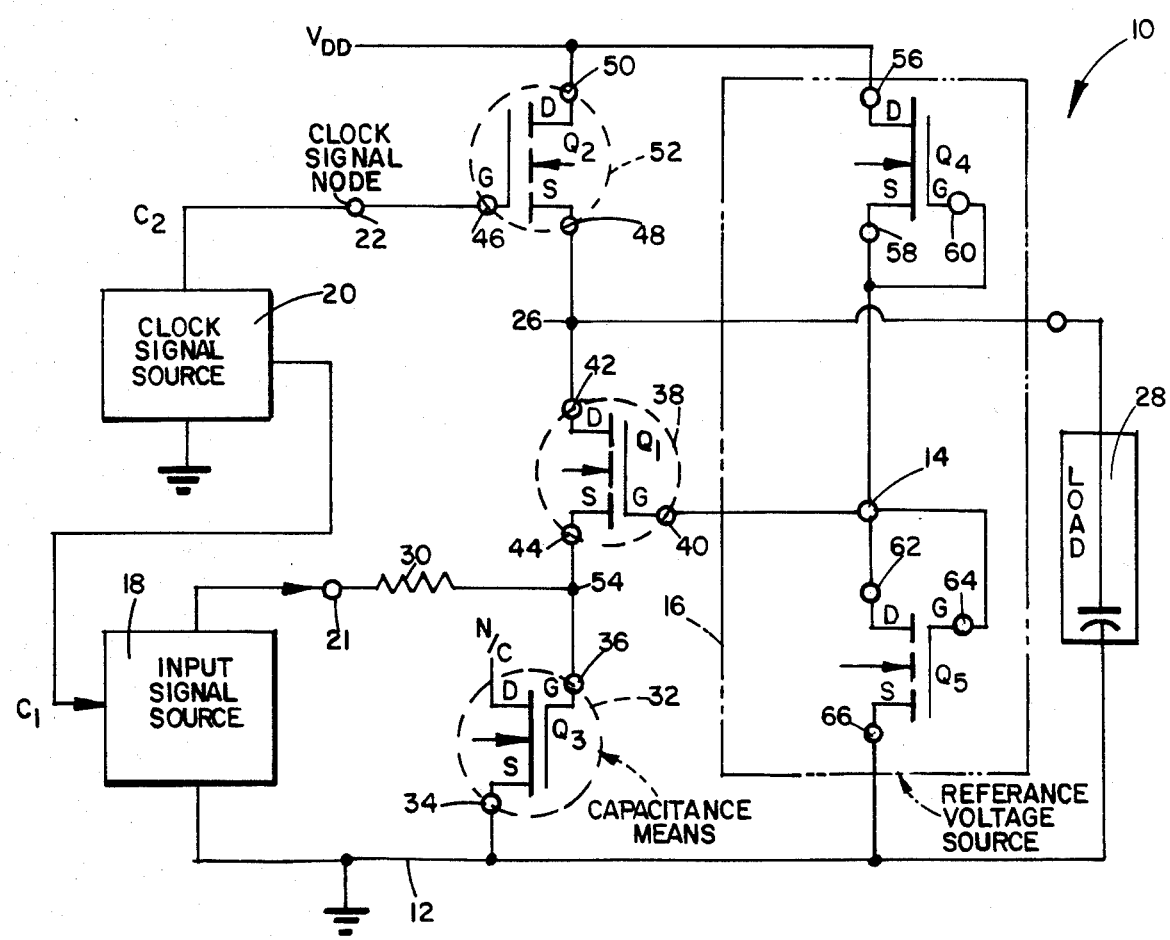
FIG. 1 is a schematic illustrative of the invention time delay circuit.

In accordance with the present invention, FIG. 1 is a schematic illustration of the invention time delay circuit 10 adapted to operate between a voltage source VDD and a reference potential, such as ground 12, and having a voltage reference node 14 adapted to receive a reference voltage from a reference voltage source 16, an input signal source 18 adapted to provide an input signal at an input signal node 21, a first and second clock signal source 20 respectively providing first and second clock signals, such as first clock signal C1 and second clock signal C2, the first clock signal being periodic and having a first and second logic level. A clock signal node 22 is adapted to receive the second clock signal having a first and second logic level from the second clock signal source 20, the second clock signal C2 being a logical complement of the first clock signal C1.

Figure 2:
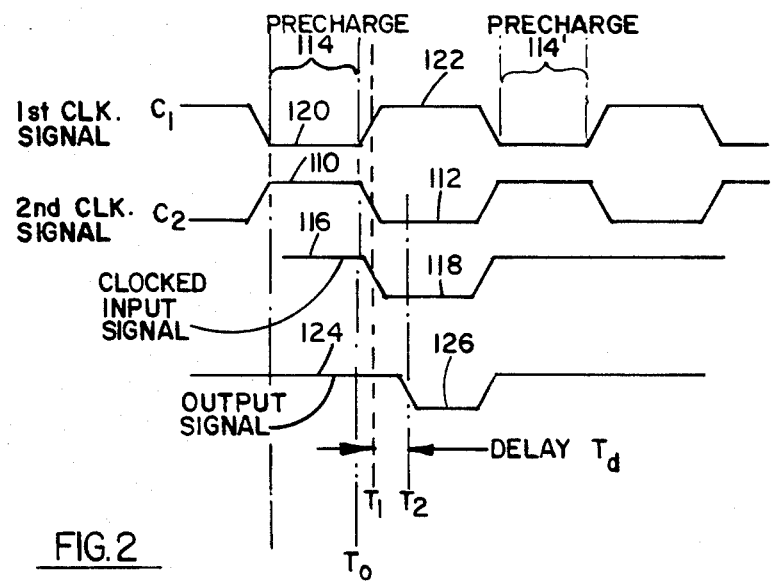
FIG. 2 is a waveform diagram illustrating the time dependent voltage relationships within the invention time delay circuit.

Referring to FIG. 2, the first clock signal is depicted as waveform C1 and the second clock signal is depicted as waveform C2. The second clock signal C2 is shown as the complement of the first clock signal C1. The second clock signal first logic level is indicated by reference 110 and the second clock signal second logic level is indicated at reference 112. First logic level 110 is positive with respect to the reference potential (not shown). Second clock signal first logic level 110 remains positive with respect to the reference potential for the precharge interval 114. The clocked input signal is depicted transferring from a first logic level 116 to a second logic level 118 concurrently with the first clock signal C1 transferring from a second logic level 120 to a first logic level 122 at time To. The input signal is further adapted to change from a first logic level 116 to a second logic level 118 at times concurrent with the second clock level C2 changing from a first logic level 110 to a second logic level 112.

Referring to FIG. 1, an output signal node 26 is coupled to a capacitive load 28, the time delay circuit 10 comprising: a resistor 30, capacitance means 32 having a first and second node 34, 36, the first node 34 being connected to the reference potential 12, the resistor 30 being connected between the input signal node 21 and the capacitance means second node 36.

A first multiterminal semiconductor device 38 is depicted having a control electrode 40 and a conduction channel having a first and second terminal 42, 44, the first multiterminal semiconductor device control electrode 40 being connected to the voltage reference node 14. The first multiterminal semiconductor device conduction channel second terminal 44 is connected to the capacitance means second node 36. The first multiterminal semiconductor device conduction channel first terminal 42 being connected to the output signal node 26.

A second multiterminal semiconductor device 52 is included having a control electrode 46 and a conduction channel having a first and second terminal 48, 50, the second multiterminal semiconductor device control electrode 46 being connected to the clock signal node 22. The second multiterminal semiconductor device conduction channel first terminal is connected to the output signal node 26, and the second multiterminal semiconductor device conduction chanel second terminal 50 being connected to the voltage source VDD.

The time delay circuit is responsive to the second clock signal first logic level 110 applied to clock signal node 22. Second multiterminal semiconductor device Q2 is driven into conduction delivering current to output signal node 26 to precharge capacitive load 28. The voltage on the capacitive load 28 increases to a first logic level voltage 124 as depicted in FIG. 2. At a time subsequent to the precharge interval 114, such as To, the invention time delay circuit 10, in response to a clocked input signal, at input signal node 21, discharges the output signal node voltage at time T2 after a predetermined delay interval Td measured from the input signal changing from a first logic level to a second logic level during the interval between To and T1; T1 typically being the time at which the waveform penetrates a voltage at the mid point between the first and second logic levels.

The embodiment of FIG. 1 depicts the first and second multiterminal semiconductor devices Q1, Q2 as being field effect transistors. More particularly, when the voltage source VDD is a positive source with respect to the reference potential 12 such as ground, the first and second multiterminal semiconductor devices are preferably n-channel enhancement mode metal oxide field effect transistors.

The resistor 30 is typically formed from polycrystalline silicon; however, alternate embodiments anticipate the use of diffused semiconductor resistors, trimmed metallization path resistors, or discrete resistors. A distributed resistor and capacitor combination is also anticipated eliminating the need for field effect transistor Q3.

The capacitance means 32 is typically comprised of a n-channel depletion mode metal oxide field effect transistor such as Q3, having a control grid such as the Q3 gate G and a conduction channel having a first node, such as the Q3 source S. The Q3 gate G is connected to the capacitance means second node 36 and the Q3 source S is connected to the capacitance means first node 34. The depletion mode metal oxide field effect transistor provides a predetermined capacitance between the capacitance means first and second node 34, 36.

In the embodiment of FIG. 1, the voltage source VDD is positive with respect to the reference potential 12, such as ground, and the first and second multiterminal semiconductor devices are n-channel enhancement mode metal oxide field effect transistors Q1, Q2, and wherein the first clock signal first logic level is a positive voltage with respect to the reference potential 12, such as ground, having a value relatively close to the voltage source voltage VDD. In this particular embodiment, each clock signal second logic level 120, 112, and the input signal second logic level 118 have voltages relatively close to the reference potential 12, such as ground.

An alternate preferred embodiment of the invention includes the reference voltage circuit 16 coupled to the voltage reference node 14. The alternate embodiment includes a precharging means interposed between the voltage source VDD and the output signal node 26, the precharging means being responsive to the second clock signal C2 first logic level 110 at the clock signal node 22 for precharging the voltage on the capacitive load 28. The alternate embodiment includes the switching means 38 interposed between the output signal node 26 and a timing voltage node 54 for coupling the output voltage node 26 to the timing voltage node 54. The switching means is responsive to the voltage difference between the voltage at the voltage reference node 14 and the voltage at the timing voltage node 54 exceeding a predetermined threshold, typically slightly more than the threshold voltage of switching means 38. Reference voltage source 16 must be adapted to provide a reference voltage at voltage reference node 14 that is greater in magnitude than the threshold voltage of switching means 38. Timing capaictance means 32 is included for storing a predetermined charge. The timing capacitance means 32 is connected between the timing voltage mode 54 and the reference potential 12, such as ground. In this alternative embodiment, the resistor 30 is interposed between the input signal node 21 and the timing voltage node 54.

The reference voltage source 16 includes a fourth and fifth multiterminal semiconductor device Q4, Q5, each multiterminal semiconductor device having a respective control grid and a respective conduction channel having a first and second terminal. The fourth multiterminal semiconductor device conduction channel first terminal 56 is connected to the voltage source VDD. The fourth multiterminal semiconductor device conduction channel second terminal 58 is connected to the fourth multiterminal semiconductor device control electrode 60, to the voltage reference node 14, to the fifth multiterminal semiconductor device conduction channel first terminal 62 and to the fifth multiterminal semiconductor device control electrode 64. The fifth multiterminal semiconductor device conduction channel second terminal 66 is connected to the reference potential 12, such as ground. The fourth multiterminal semiconductor device Q4 provides bias current to the voltage reference node 14. The fifth multiterminal semiconductor device Q5 is adapted to conduct the bias current from the voltage reference node 14 to the reference potential 12, such as ground. The fourth and fifth multiterminal semiconductor devices Q4, Q5 are adapted to form a relatively stable voltage reference source at the voltage reference node 14.

The switching means 38 further comprises a first multiterminal semiconductor device Q1 having a control electrode and a conduction channel having a first and second terminal 42, 44. The Q1 conduction channel first terminal 42 is connected to the output signal node 26, the Q1 conduction channel second terminal 44 is connected to the timing voltage node 54, and the Q1 control grid 40 is connected to the voltage reference node 14.

The precharging means 52 further comprises a second multiterminal semiconductor device Q2 having a conduction channel having a first and second terminal and a control electrode. The Q2 conduction channel second terminal 50 is connected to the voltage source VDD. The Q2 conduction channel first terminal 48 is connected to the output signal node 26, the Q2 control electrode is connected to the clock signal node 22.

The timing capacitance means 32 further comprises a third multiterminal semiconductor device Q3 having a conduction channel having a first terminal 34 connected to the reference potential 12, such as ground. The third multiterminal semiconductor device Q3 has a control electrode, such as the Q3 gate G, connected to the timing voltage node 54.

In this alternative embodiment, the first, second and fifth multiterminal semiconductor devices Q1, Q2 and Q5 are enhancement mode field effect transistors, and the third and fourth multiterminal semiconductor devices Q3 and Q4 are depletion mode field effect transistors. In this alternative and particularly preferred embodiment, the resistor 30 is formed from polycrystalline silicon and the field effect transistors are n-channel devices. The voltage source is a positive voltage with respect to the reference potential and the first logic level of the C1 and C2 clock signals respectively are a relatively positive voltage with respect to the second logic level.

CIRCUIT OPERATION

The invention time delay circuit of FIG. 1 receives an input signal consisting of a first logic level followed by a second logic level at input signal node 21 and provides an output at output signal node 26 consisting of a delayed transition from a first logic level 124 to a second level 126. The transition at the output signal node 26 from a first logic level to a second logic level follows a drop in voltage at the timing voltage node 54 resulting from the discharge of the capacitance provided by the Q3 FET between its gate and channel. The resistor 30 provides the required discharge path, and the value of the resistor and the value of the capacitance provided by Q3 combine to enable the design of a predetermined time delay. As the voltage at the timing voltage node 54 decays subsequent to the input signal node voltage being switched to a value relatively close to ground, the voltage difference between the gate and source of Q1 exceeds the threshold, Vth, of the Q1 FET, thereby switching the Q1 FET into conduction and connecting the output signal node 26 to the timing voltage node 54. The resistor 30 continues to provide a discharge path for the combined capacitance of the capacitive load connected to the output signal node 26 and the capacitance provided by the Q3 FET. Throughout interval 122, the Q2 FET remains cut off since the C2 clock signal remains at a second logic level being relatively close to ground level.

The capacitance provided by the Q3 FET is voltage dependent and increases to its design value as the voltage difference between the Q3 gate and source exceed the Q3 threshold. The capacitance provided by the Q3 FET is increased by process adjustments and mask adjustments including increasing the gate to channel area and decreasing the gate to channel dielectric thickness. The Q3 FET must be a depletion mode FET to obtain a suitable level of capacitance.

Subsequent to discharging the capacitive load 28 on the output signal node 26, the input signal changes from a second logic level to a first logic level concurrent with the second clock signal C2 changing from a second logic level to a first logic level at clock signal node 22. The Q2 FET is driven into conduction by the second logic level at clock signal node 22. The Q2 FET provides a conduction path to the output signal node 26 from the voltage source VDD thereby charging the capacitive load 28 to a voltage approximately one threshold Vth below the voltage source VDD. Current from the Q2 FET to the output signal node 26 also passes through the Q1 FET from its drain to source to the timing voltage node 54 charging the capacitance means Q3 to a voltage one threshold Vth below the voltage at the voltage reference node 14. Subsequent to the voltage at the timing voltage node 54 rising to a voltage of one threshold Vth below the reference voltage, the Q1 FET cuts off. The voltage at the timing voltage node 54 continues to rise positively above the value at which the Q1 FET cuts off as a result of charging current through resistor 30 from the input signal node 21.

The reference voltage source formed by FETs Q4 and Q5 provides a reference voltage of several tenths of a volt more than one threshold voltage Vth at the voltage reference node 14. FET Q4 is shown as an n-channel depletion mode FET having its gate 60 connected to its source 58 and as a result of this connection it operates as a current source providing a bias current to the voltage reference node 14. As a result of this bias current, voltage reference node 14 rises positively. Since the Q5 FET gate is connected to the Q5 FET drain and to the voltage reference node 14, the FET Q5 gate voltage rises with the voltage at the voltage reference node 14 in response to bias current being provided by FET Q4. The FET Q5 gate voltage rises until the voltage difference between the FET Q5 gate and the Q5 source is sufficient to increase the conductivity of the Q5 FET to a point where all of the bias current from FET Q4 passes through Q5. In practive, the bias current from Q4 is adjusted to raise the voltage at the Q5 gate to a point several tenths of a volt in excess of one Vth. Small variations in the threshold voltage of FET Q5 as a result of temperature and process changes tend to compensate for threshold variations associated with FET Q1.

Alternative circuit embodiments envision a combination of the resistor 30 and the capacitance means into a single device. A distributed resistor is formed of polysilicon on top of a thin layer of dielectric material. The dielectric material is formed above an n+ plus region. The lower surface of the resistor in combination with the dielectric layer and the n+ region below the dielectric layer form a distributed combination resistor and capacitor. A structure of the type described is relatively insensitive to variations in the resistor width, in view of the fact that as the resistor width is allowed to decrease, the resulting resistance increases and the resulting capacitance below the resistor is decreased. The resulting RC product remains relatively constant in response to the aforementioned resistor width variation. A circuit employing a distributed resistor and capacitor as described, would not require the employment of FET Q3 in view of the distributed capacitance formed beneath the polysilicon resistor.

The invention time delay circuit is adapted to receive an input signal from an inverter circuit. The capacitive load 28 is typically at least one FET gate.

There is thus provided a time delay circuit providing an output signal having a predetermined delay in response to an input signal that uses relatively few FET devices, and which is relatively insensitive to temperature variations. The description provided is intended to be illustrative only and is not intended to be limitive. Modifications of the invention time delay circuit which fall within the purview of the description are intended to be included therein as well. The scope of this invention shall be determined from the scope of the following claims including their equivalents.

What is claimed is:

1. A time delay circuit for operation between a voltage source and a reference potential, such as ground, and having
  voltage reference node for receiving a reference voltage from a reference voltage source,
  an input signal source for providing an input signal at an input signal node,
  a clock signal source for providing a clock signal, said clock signal being periodic and having a first and second logic level,
  a clock signal node for receiving said clock signal having a first and second logic level from said clock signal source,
  said input signal being further characterized by changing from a first logic level to a second logic level at times concurrent with said clock signal changing from a first logic level to a second logic level,
  an output signal node coupled to a capacitive load, said time delay circuit comprising:
    a resistor,
    a capacitance means having a first and second node, said first node being connected to said reference potential, said resistor being connected between said input signal node and said capacitance means second node,
    a first multiterminal semiconductor device having a control electrode and a conduction channel having a first and second terminal, said first multiterminal semiconductor device control electrode being connected to said voltage reference node, said first multiterminal semiconductor device conduction channel second terminal being connected to said capacitance means second node, said first multiterminal semiconductor device conduction channel first terminal being connected to said output signal node,
    a second multiterminal semiconductor device having a control electrode and a conduction channel having a first and second terminal, said second multiterminal semiconductor device control electrode being connected to said clock signal node, said second multiterminal semiconductor device conduction channel first terminal being connected to said output signal node, and said second multiterminal semiconductor device conduction channel second terminal being connected to said voltage source;
  whereby, said time delay circuit being responsive to said clock signal first logic level precharges said output signal node voltage on said capacitive load to a corresponding first logic level voltage and at a time subsequent to said precharge interval, said time delay circuit, in response to a clocked input signal, discharges said output signal node voltage after a predetermined delay interval measured from said input signal changing from a first logic level to a second logic level.

2. The combination of claim 1, wherein said first and second multiterminal semiconductor devices are field effect transistors.

3. The combination of claim 1, wherein said voltage source is positive with respect to said reference potential and said first and second multiterminal semiconductor devices are n-channel enhancement mode metal oxide field effect transistors.

4. The combination of claim 1, wherein said resistor is formed from polycrystalline silicon.

5. The combination of claim 1, wherein said capacitance means is further comprised of a third multiterminal semiconductor device having a control electrode and a conduction channel having a first terminal, said control electrode being connected to said capacitance means second node and said conduction channel first terminal being connected to said capacitance means first node;

whereby, said third multiterminal semiconductor device provides a predetermined capacitance between said capacitance means first and second node.

6. The combination of claim 1, wherein said voltage source is positive with respect to said reference potential, and said first and second multiterminal semiconductor devices are n-channel enhancement mode metal oxide field effect transistors, and wherein said first clock signal first logic level is a positive voltage with respect to said reference potential, having a value relatively close to said voltage source voltage, and said input signal voltage first logic level is a positive voltage with respect to said reference potential, having a value relatively close to said voltage source voltage, each said clock signal second logic level and said input signal second logic level having voltages relatively close to said reference potential.

7. The combination of claim 2, wherein said capacitance means is further comprised of a depletion mode metal oxide field effect transistor having a control electrode and a conduction channel having a first node said control electrode being connected to said capacitance means second node and said conduction channel first node being connected to said capacitance means first node; whereby, said depletion mode metal oxide field effect transistor provides a predetermined capacitance between said capacitance means first and second node.

8. The combination of claim 7, wherein said first and second multiterminal semiconductor devices are n-channel enhancement mode metal oxide field effect transistors, and wherein said first clock signal first logic level is a positive voltage with respect to said reference potential, having a value relatively close to said voltage source voltage, and said input signal voltage first logic level is a positive voltage with respect to said reference potential, having a value relatively close to said voltage source voltage, said clock signal second logic level and said input signal second logic level having voltages relatively close to said reference potential.

9. The combination of claim 8, wherein said resistor is formed from polycrystalline silicon.

10. The combination of claim 5, wherein said third multiterminal semiconductor device having a control electrode and a conduction channel having a first terminal is a depletion mode metal oxide field effect transistor.

11. A time delay circuit for operation between a voltage source and a reference potential, such as ground, and having an input signal source for providing an input signal at an input signal node, a clock signal source for providing a clock signal, said clock signal being periodic and having a first and second logic level, a clock signal node for receiving said clock signal having a first and second logic level from said clock signal source, said input signal being further characterized by changing from a first logic level to a second logic level at times concurrent with said clock signal changing from a first logic level to a second logic level, an output signal node coupled to a capacitive load, said time delay circuit comprising:

a reference voltage source circuit having a voltage reference node, precharging means coupled between said voltage source and said output signal node, said precharging means being responsive to said clock signal first logic level at said clock signal node for precharging the voltage on said capacitive load, switching means interposed between said output signal node and a timing voltage node for coupling said output voltage node to said timing voltage node, said switching means being responsive to the voltage difference between the voltage at the voltage reference node and the voltage at the timing voltage node exceeding a predetermined threshold, timing capacitance means for storing a predetermined charge, said timing capacitance means being connected between said timing voltage node and said reference potential, a resistor coupled between said input signal node and said timing voltage node;

whereby, said time delay circuit being responsive to said clock signal first logic level precharges said output signal node voltage on said capacitive load to a corresponding first logic level voltage and at a time subsequent to said precharge interval, said time delay circuit discharging said output signal node voltage after a predetermined delay interval measured from said input signal changing from a first logic level to a second logic level.

12. The combination of claim 11, wherein said reference voltage source circuit further comprises:

a current source and current sink multiterminal semiconductor device (Q4, Q5), each multiterminal semiconductor device having a respective control electrode and a respective conduction channel having a first and second terminal, said current source multiterminal semiconductor device (Q4) conduction channel first terminal being connected to said voltage source, said current source multiterminal semiconductor device conduction channel second terminal being connected to said current source multiterminal semiconductor device control electrode, to said voltage reference node, to said current sink multiterminal semiconductor device conduction channel first terminal and to said current sink multiterminal semiconductor device (Q5) control electrode, said current sink multiterminal semiconductor device conduction channel second terminal being connected to said reference potential;

whereby, said current source multiterminal semiconductor device provides bias current to said voltage reference node, said current sink multiterminal semiconductor device being characterized by conducting said bias current to said reference potential, said current source and current sink multiterminal semiconductor devices being characterized by forming a fixed voltage reference source at said voltage reference node.

13. The combination of claim 12, wherein said switching means further comprises a first multiterminal semiconductor device having a control electrode and a conduction channel having a first and second terminal, said first multiterminal semiconductor device conduction channel first terminal being connected to said output signal node, said first multiterminal semiconductor device conduction channel second terminal being connected to said timing voltage node, said first multiterminal semiconductor device control electrode being connected to said voltage reference node, and wherein said precharging means further comprises a second multiterminal semiconductor device having a conduction channel having a first and second terminal and a control electrode, said second multiterminal semiconductor device conduction channel second terminal being connected to said voltage source, said second multiterminal semiconductor device conduction channel first terminal being connected to said output signal node, said second multiterminal semiconductor device control electrode being connected to said clock signal node, and wherein said timing capacitance means further comprises a third multiterminal semiconductor device having a conduction channel having a first terminal connected to said reference potential, said third multiterminal semiconductor device having a control electrode, said third multiterminal semiconductor device control electrode being connected to said timing voltage node.

14. The combination of claim 13, wherein said first, second, and current sink (Q5) multiterminal semiconductor devices are enhancement mode field effect transistors, and wherein said third and current source (Q4) multiterminal semiconductor devices are depletion mode field effect transistors.

15. The combination of claim 14, wherein said resistor is formed from polycrystalline silicon.

16. The combination of claim 11, wherein said field effect transistors are n-channel field effect transistors and wherein said voltage source is a positive voltage with respect to said reference potential and wherein said first logic level is a relatively positive voltage with respect to said second logic level.

* * * * *

UNITED STATES PATENT AND TRADEMARK OFFICE
CERTIFICATE OF CORRECTION

PATENT NO. : 4,503,345
DATED : March 5, 1985
INVENTOR(S) : Michael M. Yamamura

It is certified that error appears in the above–identified patent and that said Letters Patent are hereby corrected as shown below:

Column 4, line 54 - change "grid" to "electrode"

Column 5, line 30 - change "mode" to "node"

Column 5, line 67 - change "grid" to "electrode"

Column 6, line 35 - insert "logic" after "second"

Signed and Sealed this

Thirteenth Day of May 1986

[SEAL]

Attest:

Attesting Officer

DONALD J. QUIGG

Commissioner of Patents and Trademarks